United States Patent [19]

Mowry et al.

[11] Patent Number: 4,821,133

[45] Date of Patent: Apr. 11, 1989

[54] BOTTLENECK MAGNETORESISTIVE ELEMENT

[75] Inventors: Greogory S. Mowry, Burnsville; Terry B. Mitchell, Minneapolis; Charles H. Tolman; Peter K. George, both of Bloomington, all of Minn.

[73] Assignee: Magnetic Peripherals, Inc., Minnetonka, Minn.

[21] Appl. No.: 152,792

[22] Filed: Feb. 5, 1988

Related U.S. Application Data

[63] Continuation-in-part of Ser. No. 15,203, Feb. 17, 1987.

[51] Int. Cl.$^4$ .......................... G11B 5/127; G11B 5/33
[52] U.S. Cl. .................................................... 360/113
[58] Field of Search ............. 360/113, 110; 338/32 R; 324/252

[56] References Cited

U.S. PATENT DOCUMENTS

| 4,535,375 | 8/1985 | Mowry et al. | 360/113 |
| 4,556,925 | 12/1985 | Suenaga et al. | 360/113 |
| 4,731,757 | 3/1988 | Daughton et al. | 365/173 |

FOREIGN PATENT DOCUMENTS 0153523  11/1981  Japan .................................. 360/113

*Primary Examiner*—Stuart N. Hecker
*Assistant Examiner*—David J. Severin
*Attorney, Agent, or Firm*—Edward P. Heller, III

[57] ABSTRACT

A magnetoresistive sensor element having bottleneck shaped ends. The sensor element has a highly stable, single domain central region, which eliminates Barkhausen noise.

4 Claims, 2 Drawing Sheets

BOTTLENECK MAGNETORESISTIVE ELEMENT

This application is a continuation-in-part of Mowry, G., Ser. No. 015,203, filed 02/17/1987.

1. FIELD OF THE INVENTION

The invention relates to the field of magnetoresistive sensor elements and more particularly to those intended to be incorporated into magnetoresistive leads.

2. BRIEF DESCRIPTION OF THE PRIOR ART

The output of magnetoresistive sensors is adversely affected by multiple magnetic domains in the sense regions, the walls of which suddenly move under influence of the magnetic fields being sensed. This sudden movement of domain walls causes an uneven response in sensor output, limiting the usefulness of the sensor. Efforts have been made to provide a single domain in the sense region during sensor "read" operations to avoid Barkhausen noise. Among these efforts have been efforts to shape the sensor in such a manner that the sensor is single domain in the active region.

One example of shaping is the so-called "football"-shaped sensor element. See e.g., Suenaga No. 4,556,925, at FIG. 8 and Mowry, Ser. No. 015,203, of which this application is a continuation-in-part and which is hereby incorporated by reference. The football-shaped sensor element has a highly stable central single domain. However, experience has shown that even this sensor element can be fractured into two horizontal domains under the influence of high external fields (such as one may find if the sensor element is incorporated into a read/write head) which drives the element into hard axis saturation. Further, routine photolithographic process variations could significantly blunt the end points of the "football", thereby eliminating the very geometry which stabilized the single domain central portion.

SUMMARY OF THE INVENTION

The invention comprises replacing the points of the "football" with a bottleneck structure of unlimited length. The resulting structure is denominated "bottleneck magnetoresistive element."

This structure provides for an extremely stable central single domain which reestablishes itself even after the central region has been saturated in the hard axis direction. Further, the bottleneck is fairly maintained independent of extreme photolitographic process variations.

DESCRIPTION OF THE PREFERRED EMBODIMENT

Figure 1:
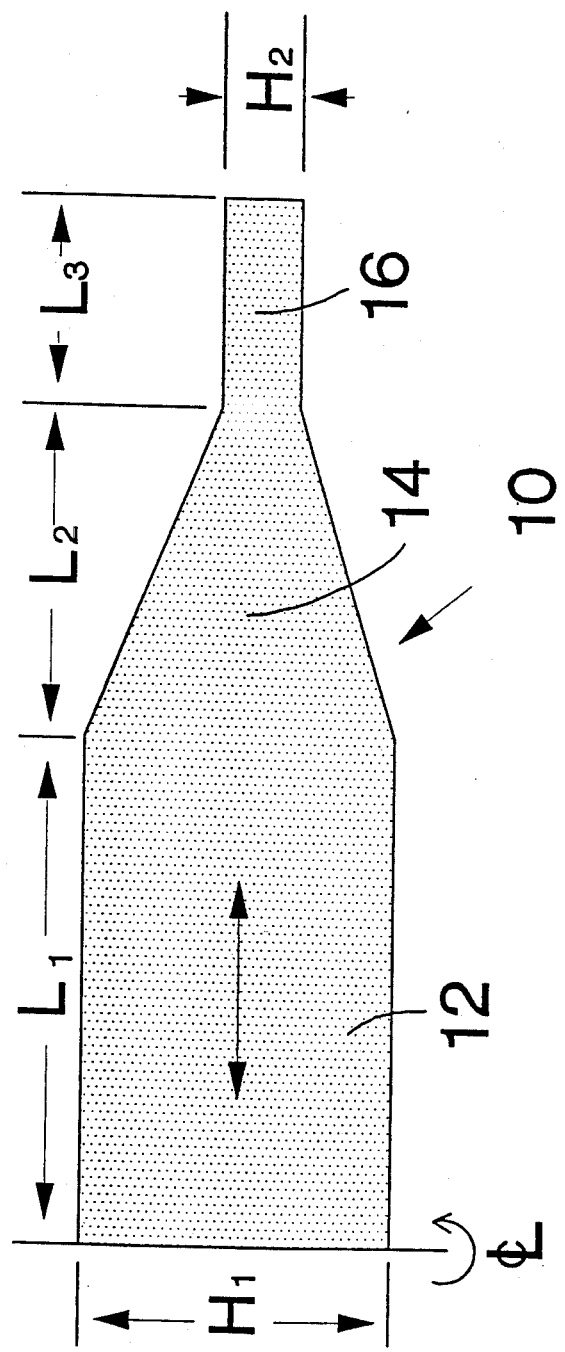
FIG. 1 is a partial plan view of the preferred bottleneck magnetoresistive element which is symmetrical about the centerline.

FIG. 1 shows the preferred shape of the bottleneck magnetoresistive element 10. The element is symmetrical about the centerline. The element includes three regions: A central region 12 with opposed parallel sides. This is the thickest region. A transition region 14 with inwardly inclined sides. And finally, a bottleneck region 16 generally rectangular in shape.

The preferred material for the bottleneck magnetoresistive element is nominally 80:20 NiFe alloy. However, it may be constructed from any appropriate magnetoresistive material. The easy axis of the material is normally oriented along the axis of the sensor element 10 (parallel to the sides of the central region 12) as indicated by the arrow in FIG. 1, but may be skewed slightly as in the alternative embodiment shown in FIG. 2, i.e., the easy axis of both embodiments, FIG. 1 and FIG. 2, may be parallel or skewed, depending upon the application for the element (skewing slightly linearizes the output of an MR sensor).

The following are an experimentally derived set of parameters for the lengths and heights of the three regions:

| PARAMETER | RANGE ($\mu$m) | PRACTICAL LIMITS ($\mu$m) |
|---|---|---|
| $H_1$ | 2–15 | 4–10 |
| $H_2$ | 1–3 | 1–3 |
| $L_1$ | 0–$\infty$ | 5–50 |
| $L_2$ | 10–$\infty$ | 15–25 |
| $L_3$ | 5–25 | 10–20 |
| THICKNESS | 50–1000Å | 150–700Å |

In practical utilization, those skilled in the art will appreciate that conductors for sensing the change in resistivity of the element under influence of external fields should be applied as shown, for example, in FIG. 5 of Suenaga et al., No. 4,556,925 or FIG. 12 of Mowry, Ser. No. 015,203, above referenced.

Figure 2:
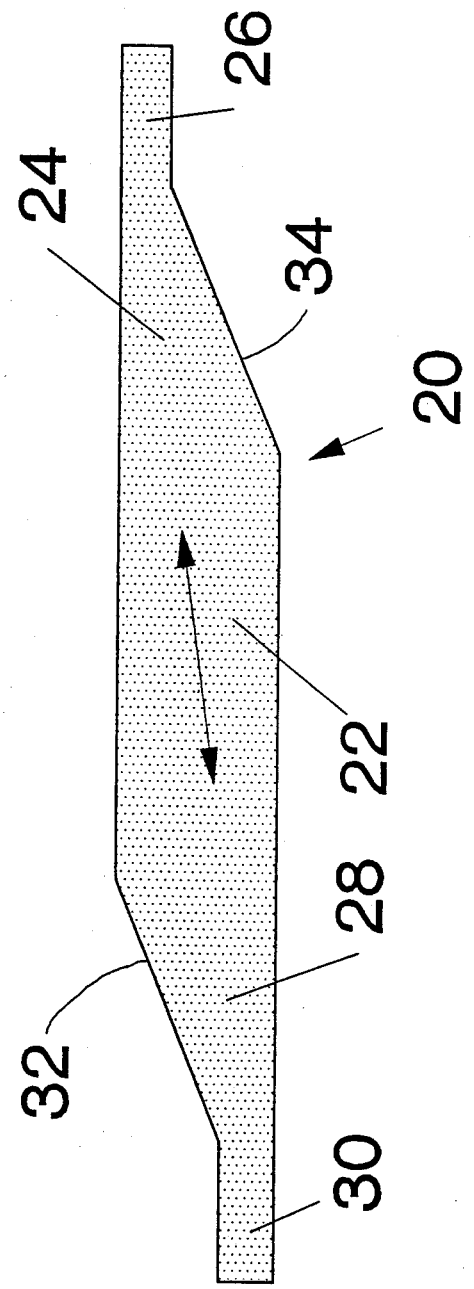
FIG. 2 is a plan view of an alternative skewed embodiment.

FIG. 2 shows an alternative skewed embodiment 20. This embodiment is not symmetrical about a centerline. Rather, on one side the bottleneck 30 occurs on the lower half of the element and on the other the bottleneck 26 occurs on the upper half of the element. Essentially, the element's transition regions 24, 28 are skewed relative to one another. The element comprises a wide central region 22 with opposed parallel sides, and a pair of opposed, skewed relative to one another, transition regions 24, 28 with at least one inclined side, 34, 32 respectively, leading to the respective rectangular bottlenecks 26, 30.

If the bottlenecks 26, 30 are arranged so that they are flush with the sides of the central region 22, as shown in the Figure, then the respective transition regions 24, 28 include only one inclined side, 34 or 32 respectively. However, structures where the bottleneck regions are not flush with the central region are contemplated within the scope of the invention. In such structures, the transition regions will have two inclined sides as in the first embodiment shown in FIG. 1. The easy axis orientation in the skewed embodiment of FIG. 2 may or may not be skewed relative to the parallel sides of the central region.

We claim:

1. A bottleneck magnetoresistive sensor element having a central wide portion with opposed substantially parallel sides and two ends, a narrowing transition portion connected to each end with at least one inclined side, and a bottleneck portion connected to each transition portion, the bottleneck portion having a width less than the central wide portion and being rectangular in shape with the sides of the rectangle's long dimension being substantially parallel with the sides of said central region.

2. The magnetoresistive element of claim 1 wherein the shape is symmetrical about a centerline substantially parallel with the ends of said central wide portion.

3. The magnetoresistive element of claim 1 wherein the easy axis of the element is oriented in a direction parallel to the opposed parallel sides of the central wide portion.

4. The magnetoresistive element of claim 1 wherein the easy axis of the element is oriented in a direction skewed relative to the opposed parallel sides of the central wide portion.

* * * * *